United States Patent
Chen et al.

(10) Patent No.: US 8,068,003 B2
(45) Date of Patent: Nov. 29, 2011

(54) INTEGRATED CIRCUITS WITH SERIES-CONNECTED INDUCTORS

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/721,402

(22) Filed: Mar. 10, 2010

(65) Prior Publication Data

US 2011/0221560 A1    Sep. 15, 2011

(51) Int. Cl.
*H01F 5/00*    (2006.01)

(52) U.S. Cl. .................... 336/200; 336/223; 336/232

(58) Field of Classification Search .............. 336/200, 336/223, 232
See application file for complete search history.

(56) References Cited

U.S. PATENT DOCUMENTS

| | | | |
|---|---|---|---|
| 2,549,825 A * | 4/1951 | Labin | 455/341 |
| 4,626,816 A | 12/1986 | Blumkin et al. | |
| 5,610,433 A | 3/1997 | Merrill et al. | |
| 6,339,320 B1 * | 1/2002 | Spremo et al. | 323/355 |
| 6,801,114 B2 * | 10/2004 | Yang et al. | 336/200 |
| 7,135,951 B1 | 11/2006 | Sidhu | |
| 7,187,174 B2 * | 3/2007 | Iwadate et al. | 324/318 |
| 7,663,463 B2 * | 2/2010 | Lin et al. | 336/200 |
| 7,768,372 B2 * | 8/2010 | Gianesello | 336/200 |
| 2001/0022019 A1 | 9/2001 | Ahn et al. | |
| 2001/0035809 A1 * | 11/2001 | Goff | 336/200 |
| 2003/0071706 A1 * | 4/2003 | Christensen | 336/200 |
| 2003/0137383 A1 * | 7/2003 | Yang et al. | 336/200 |
| 2004/0017278 A1 * | 1/2004 | Castaneda et al. | 336/200 |
| 2007/0247269 A1 * | 10/2007 | Papananos | 336/200 |
| 2007/0267718 A1 | 11/2007 | Lee | |
| 2009/0261453 A1 | 10/2009 | Matz et al. | |

OTHER PUBLICATIONS

Geen et al., "Miniature Multilayer Spiral Inductors for GaAs MMICs," GaAs IC Symposium, 1989.
Watt, Jeffrey T., et al. U.S. Appl. No. 12/363,545, filed Jan. 30, 2009.
Chen, Shuxian, et al. U.S. Appl. No. 12/623,161, filed Nov. 20, 2009.

* cited by examiner

*Primary Examiner* — Anh Mai
(74) *Attorney, Agent, or Firm* — Treyz Law Group; Jason Tsai

(57) ABSTRACT

An integrated circuit inductor may have upper and lower loop-shaped line portions that are connected in series. The upper and lower portions may have 45° bends that form hexagonal or octagonal loops. Each loop portion may have one or more turns. Intervening metal-free regions of metal routing layers may be formed between the two layers to reduce capacitive coupling. Each loop portion may have sets of two or more metal lines shorted in parallel by vias. The upper and lower loops may be laterally offset or nested to reduce capacitive coupling.

19 Claims, 7 Drawing Sheets

US 8,068,003 B2

INTEGRATED CIRCUITS WITH SERIES-CONNECTED INDUCTORS

BACKGROUND

This relates generally to integrated circuits, and more particularly, to integrated circuits with inductors.

Integrated circuits often have circuitry such as wireless communications circuitry that uses inductors. An inductor is typically formed using conductive traces arranged in a loop in layers on an integrated circuit.

An inductor formed on an integrated circuit is characterized by an inductance value and a quality factor. The inductance value is dependent on parameters such as the length of the conductive lines and the number of turns in the loop. The quality factor is dependent on the resistance of the conductive lines and coupling effects.

As integrated circuit fabrication technology advances, integrated circuit components are being scaled to increasingly small sizes. Particularly in integrated circuits such as these, it is desirable to consume minimal area when forming an inductor. At the same time, design constraints such as minimum acceptable values of inductance and quality factor must be satisfied. It can be challenging to accomplish these goals simultaneously. For example, conventional inductors that exhibit large inductance values may consume excessive amounts of surface area on an integrated circuit.

It would therefore be desirable to be able to provide improved inductors for integrated circuits.

SUMMARY

Integrated circuits may be provided with inductors that exhibit desired inductance values and quality factors while consuming minimal surface area. The inductors may be used in implementing oscillator circuits such as voltage controlled oscillator circuits, wireless circuits such as radio-frequency transceiver circuits, or other suitable circuitry. The inductors may be formed in a dielectric stack region of an integrated circuit. The dielectric stack may be formed on a substrate such as silicon.

An inductor may have a substantially octagonal shape. The inductor may have an upper loop portion that is series-connected with a lower loop portion through a metal via. The upper and lower loop portions may each include metal lines with one or more turns. The metal lines of the upper portion of the inductor loop may be formed in a first metal routing layer. The lines of the upper portion of the inductor loop may be connected using connecting lines such as underpass bridges that are formed in a second metal routing layer. The second metal routing layer may be located below the first metal routing layer.

The metal lines of the upper portion may have a first terminal that serves as a first port of the inductor. The metal lines of the upper portion may have a second terminal that includes metal vias that connect the upper portion to an intermediate metal stub that is formed in the second metal routing layer.

The metal lines of the lower portion may be formed in a third metal routing layer that is below the second metal routing layer. The lower portion may include underpass bridges that are formed in a fourth metal routing layer that is below the third metal routing layer.

The metal lines of the lower portion may have a first terminal that serves as a second port of the inductor. The metal lines of the lower portion may have a second terminal that includes the vias connecting the lower portion to the intermediate metal stub. The metal stub may therefore represent a point at which the upper and lower portions are connected in series.

Intervening dielectric layers (dielectric metal routing layers that are devoid of metal in the vicinity of the inductor) may be formed between the upper and lower portions of the inductor to lower capacitive coupling between the two portions. The upper and lower portions of the loop may each be formed using multi-layer metal lines that are shorted in parallel to decrease the series resistance of the metal lines.

The upper and lower loop portions may be substantially aligned or may be offset to lower capacitive coupling. The upper and lower loop portions may, for example, have the same diameter but may be laterally offset (i.e., shifted with respect to each other within the plane of the dielectric stack) so that the upper loop portion is partly or fully non-overlapping with respect to the lower loop portion. If desired, the lower portion may be nested within upper portion (or vice versa) so that the upper portion does not overlap with the lower portion (i.e., so that the upper and lower loops are completely non-overlapping when viewed from the top of the integrated circuit).

Inductors such as these that have intervening metal routing layers, metal lines shorted in parallel, and offset arrangements may exhibit enhanced inductor quality factors while exhibiting good inductance values and consuming relatively small amounts of surface area.

The inductors may have substantially hexagonal shapes. A hexagonal inductor may have upper and lower portions. The upper and lower portions may be formed in consecutive metal routing layers and may be connected through vias that are formed in a via layer that separates the two consecutive metal routing layers. The upper and lower portions of the hexagonal inductor may be offset from one another to reduce capacitive coupling effects. The hexagonal inductor may be formed under an input-output (I/O) pad to reduce noise.

Further features of the present invention, its nature and various advantages will be more apparent from the accompanying drawings and the following detailed description.

DETAILED DESCRIPTION

This relates to integrated circuits with inductors. The integrated circuits in which the inductors are provided may be any suitable type of integrated circuit, including processors, memory chips, programmable integrated circuits, application-specific integrated circuits, audio and video circuits, etc. The inductors may be used in implementing oscillators, radio-frequency circuits, filter circuits (e.g., for reducing noise on data or power lines), etc. Integrated circuits with wireless capabilities are sometimes described herein as an example. This is, however, merely illustrative.

Figure 1:
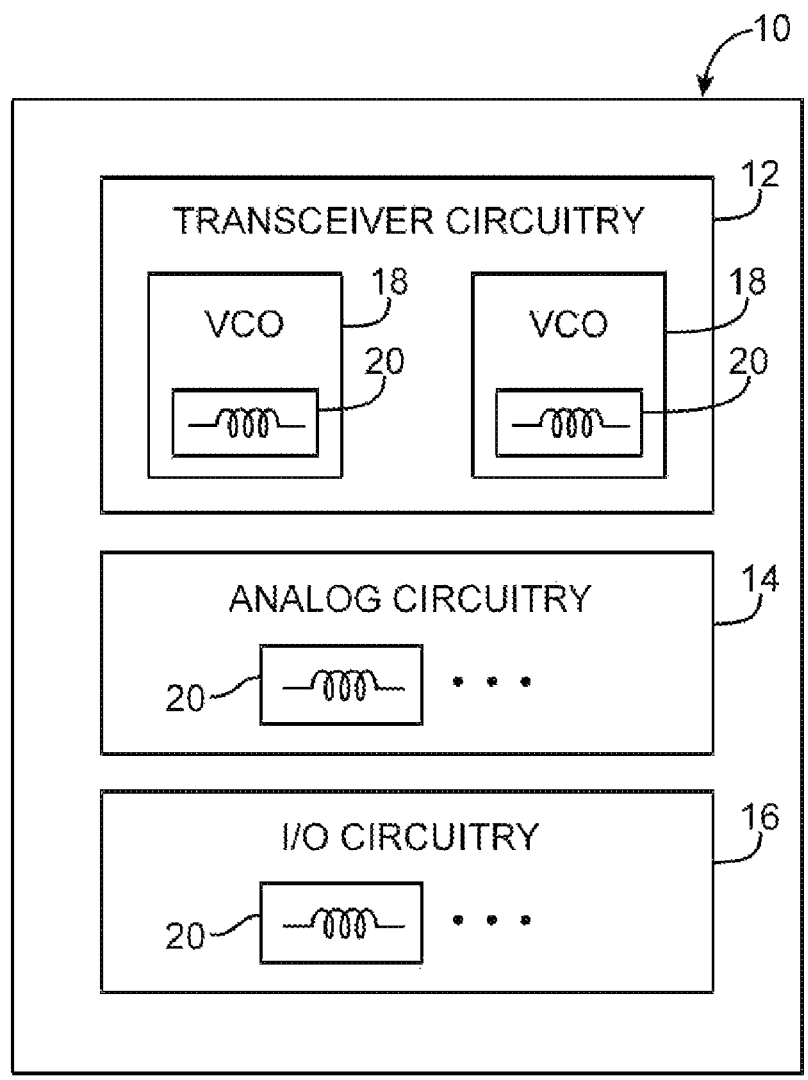
FIG. 1 is a diagram of an illustrative integrated circuit with inductors in accordance with an embodiment of the present invention.

An integrated circuit of the type that may be provided with one or more inductors is shown in FIG. 1. Integrated circuit 10 may include wireless circuitry such as radio-frequency transceiver circuitry and may therefore sometimes be referred to as a wireless integrated circuit.

As shown in FIG. 1, integrated circuit 10 may have wireless communications circuitry such as transceiver circuitry 12 and other radio-frequency circuitry. Integrated circuit 10 may have analog circuitry such as analog circuitry 14, input-output (I/O) circuitry such as I/O circuitry 16, digital circuitry, and other circuitry.

Transceiver circuitry 12 may, for example, include two voltage-controlled oscillators (VCO) such as voltage-controlled oscillators 18. The two voltage-controlled oscillators 18 may be used respectively in a high-frequency phase-locked loop and a low-frequency phase-locked loop (as an example). If desired, more than two voltage-controlled oscillators 18 or fewer than two voltage-controlled oscillators may be formed on integrated circuit 10.

Each voltage-controlled oscillator 18 may include an inductor such as one of inductors 20. Inductors 20 may sometimes be referred to as on-chip inductors, because inductors 20 are formed directly on an integrated circuit substrate (i.e., in a dielectric stack above the surface of the silicon substrate from which the circuitry of integrated circuit 10 is formed). Integrated circuit 10 may have other radio-frequency circuitry such as equalizers, filters, and matching circuits that include inductors 20. Inductors 20 may also be used in filters (e.g., to reduce noise on input-output pins, power supply lines, data lines, etc.), or in other circuits. As shown in FIG. 1, analog circuitry 14 and I/O circuitry 16 may also include inductors 20.

Inductors 20 are passive electrical components that store energy in the form of magnetic fields. Inductors 20 may be formed using conductive lines arranged in a loop. The conductive lines may be formed from patterned traces (e.g., copper traces or traces of other metals) that are formed in the layers of a dielectric stack. The dielectric stack of an integrated circuit includes layers of silicon oxide or other dielectrics within which conductive structures are formed. A dielectric stack typically includes metal interconnect layers (also sometimes referred to as metal layers or metal routing layers) and via layers. The metal routing layers may include metal routing lines (also sometimes referred to as interconnects). The via layers may contain vertical conducting structures (e.g., conductive vias such as tungsten vias or other metal vias). If desired, metal may be omitted from a portion of a metal layer or via layer (e.g., to form a region of uninterrupted dielectric). Inductors 20 may be formed from metal lines in the metal routing layers and from vias in the via layers. The configurations used for the metal lines, vias, and blank regions (i.e., the uninterrupted layers of dielectric) may be selected so as to enhance inductor performance.

Important inductor metrics include an inductance value and an inductor quality factor Q. The inductance value of an inductor may depend on the number of turns in the loop, the length/width of the conductive lines, etc. The quality factor Q of an inductor is the ratio of the energy stored in the inductor to the energy dissipated by the inductor. Inductors with low Q values are inefficient and can degrade circuit performance.

The value of Q may be affected by the resistance of the conductive lines used to form the inductor. Conductors with relatively higher resistance may produce inductors with poorer Q values. Conductors with relative lower resistance may produce inductors with higher Q values.

Quality factor Q of an inductor may also depend on the shape of the inductor. In general, inductors having a more circular shape (e.g., a circular loop pattern) may exhibit higher Q values than inductors having a square shape (e.g., a rectangular loop pattern). This is because less metal length is required to achieve the same number of turns in the loop, thereby lowering the resistance of the metal line that is used to form an inductor of a given area.

For example, consider a scenario in which a circular inductor, an octagonal inductor, a hexagonal inductor, and a square-shaped inductor each have an inductance value of 5 nH. The circular inductor, octagonal inductor, hexagonal inductor, and square-shaped inductor may have respective Q values of 6.8, 6.5, 6.0, and 5.6 at an operating frequency of 2.7 GHz (as examples).

The square-shaped inductor may be relatively more area efficient. For a given amount of surface area that is consumed (i.e., for a given "footprint") on integrated circuit 10, the square-shaped inductor may utilize approximately 100% of the area, whereas the hexagonal, octagonal, and circular inductors may occupy 65%, 82.8%, and 78.5% of the area, respectively (as examples).

To reduce the footprint of an inductor to improve area efficiency, a series-connected inductor may be formed using multiple metal routing layers connected through metal vias. Inductors formed using this approach may sometimes be referred to as series-connected spiral inductors or multi-level stacked inductors.

Figure 2A:
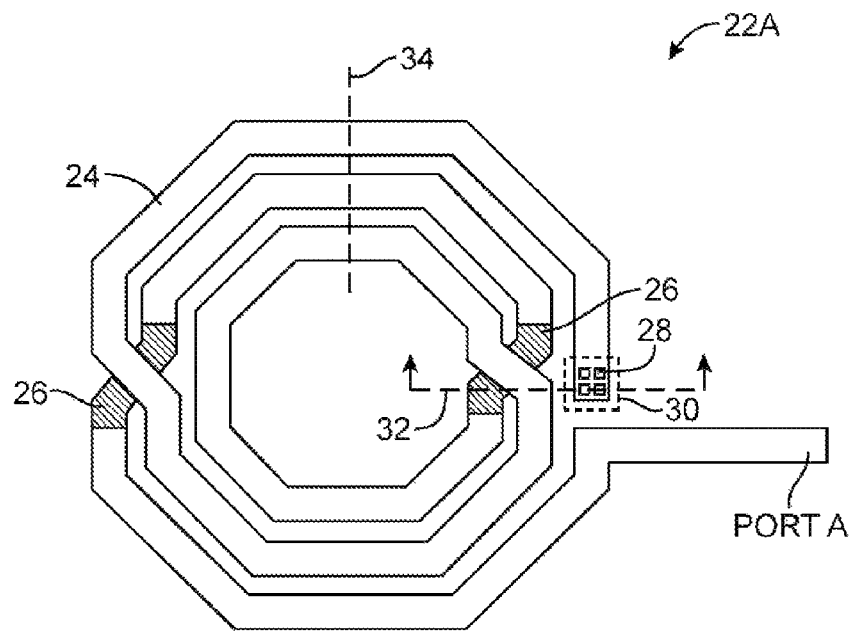
FIG. 2A is a top view of an upper portion of an illustrative octagonal series-connected inductor in accordance with an embodiment of the present invention.
Figure 2B:
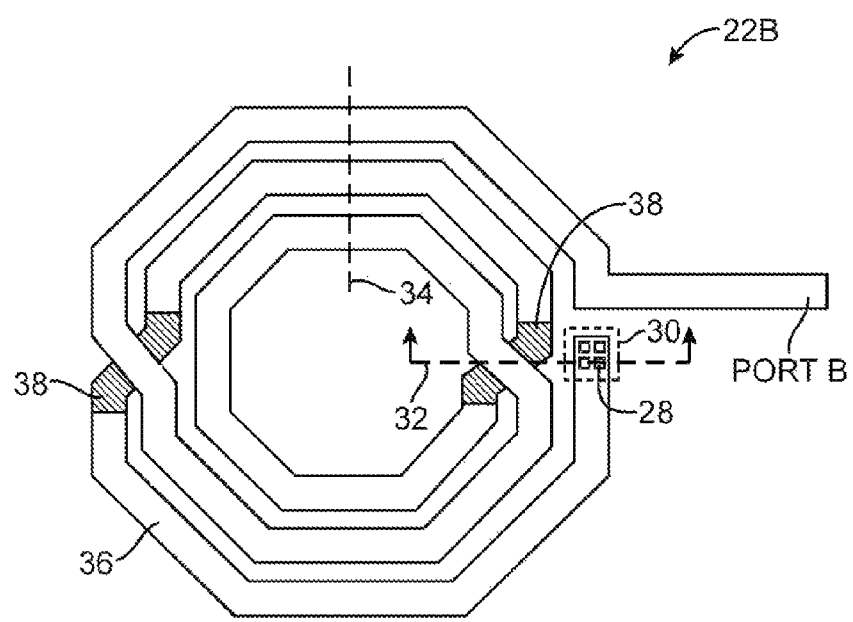
FIG. 2B is a top view of a lower portion of an illustrative octagonal series-connected inductor in accordance with an embodiment of the present invention.

With one suitable arrangement, inductor 20 may be an octagonal series-connected inductor (e.g., an inductor with eight approximately 45° bends). An octagonal series-connected inductor may have three turns and may have an upper portion such as upper portion 22A and a lower portion such as lower portion 22B, as shown in FIGS. 2A and 2B, respectively. The upper and lower portions may be series-connected through metal vias such as vias 28.

Upper portion 22A may have a first terminal such as terminal PORTA. Terminal PORTA may serve as a first input-output port of the octagonal series-connected inductor. Upper portion 22A may have three turns formed using metal lines such as metal lines 24. Lines 24 may be formed in a first metal routing layer. Metal lines such as underpass lines (bridges) 26 may be used to form desired connections, as shown in FIG. 2A. Underpass bridges 26 may be formed in a second metal routing layer that is below the first metal routing layer. If desired, overpass bridges (e.g., metal lines formed in a layer that is above the first metal routing layer) may be used to form the desired connections.

Upper portion 22A may have a second terminal that includes metal vias 28. Vias 28 may be connected to a metal stub such as metal stub 30. Stub 30 may be formed in the second metal routing layer. Stub 30 may serve as an intermediate point in the series connection between upper portion 22A and lower portion 22B.

Lower portion 22B may have a first terminal such as terminal PORTB. Terminal PORTB may serve as a second input-output port of the octagonal series-connected inductor. Lower portion 22B may have three turns formed using metal lines such as metal lines 36. Lines 36 may be formed in a third metal routing layer that is below the second metal routing layer. Underpass bridges 38 may be used to form the desired connections of FIG. 2B. Underpass lines 38 may be formed in a fourth metal routing layer that is below the third metal routing layer. If desired, overpass bridges (e.g., metal lines formed in a layer that is above the third metal routing layer) may be used to form the desired connections.

Figure 3:
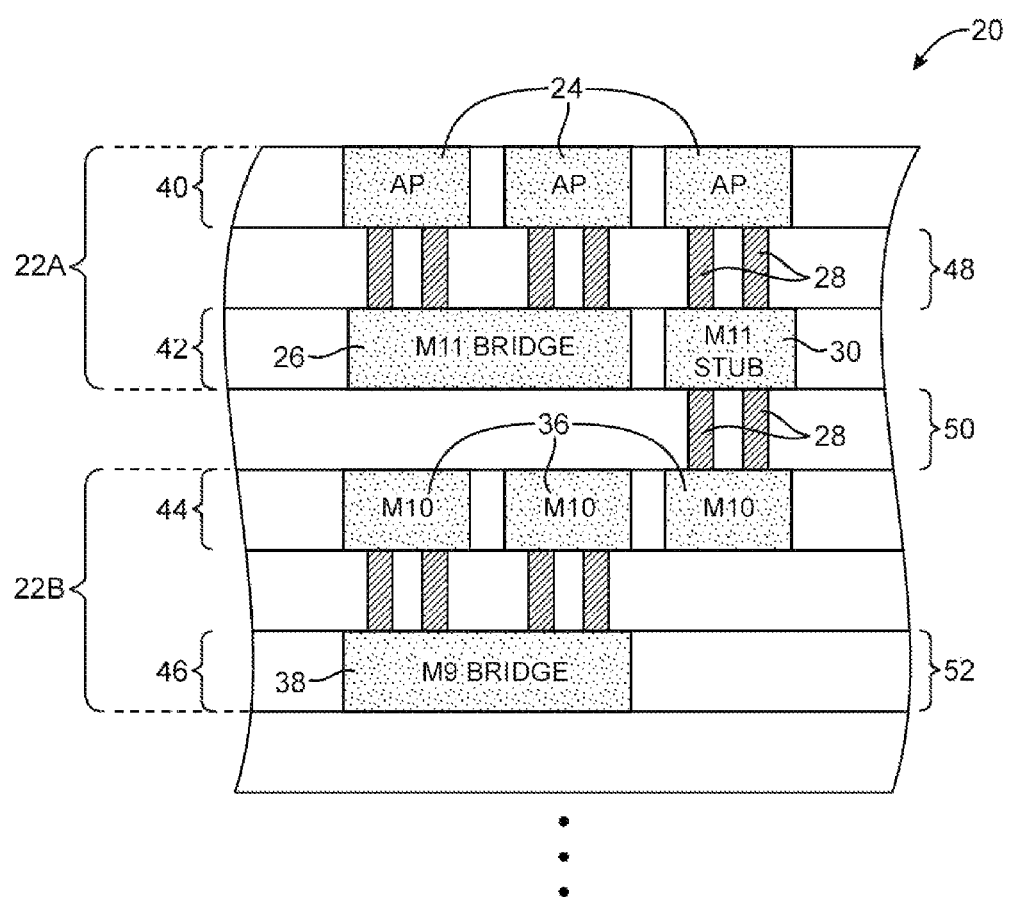
FIG. 3 is a cross-sectional side view of an illustrative series-connected inductor with no intervening metal routing layers in accordance with an embodiment of the present invention.

FIG. 3 is a cross-sectional side view of the octagonal series-connected inductor of FIGS. 2A and 2B sectioned along a cross-sectional cut on dotted line 32. Integrated circuit 10 may have a dielectric stack formed over the substrate. The dielectric stack may include multiple metal routing layers that are separated by via layers. The metal routing layers may include metal routing wires formed in dielectric material such as silicon dioxide or other insulating material. The via layers may include metal vias formed in similar dielectric material. The metal routing layers and the via layers may sometimes be referred to as interconnect layers.

Upper portion 22A of the series-connected inductor may be formed using metal routing layers 40 and 42 and via layer 48. Metal lines 24 may be formed in metal routing layer 40. Layer 40 may be a topmost layer of the dielectric stack and may be referred to as an aluminum pad (AP) layer. Underpass bridge 26 may be formed in metal routing layer 42. Layer 42 may be referred to as an M11 metal routing layer assuming integrated circuit 10 is formed using an 11 metal routing layer process (excluding the AP layer). The AP layer may include copper and/or other materials. M11 bridge 26 may be connected to respective metal lines 24 through vias 28 that are formed in via layer 48. Via layer 48 is the via layer separating AP metal routing layer 40 and M11 metal routing layer 42.

FIG. 3 shows a second terminal of upper portion 22A that has vias 28 directly connected to metal stub 30. Metal stub 30 may also be formed in M11 metal routing layer 42.

Lower portion 22B of the spiral inductor may be formed using metal routing layers 44 and 46 and via layer 52. Metal lines 36 may be formed in metal routing layer 44. Layer 44 may be referred to as an M10 metal routing layer that is one metal routing layer below the M11 metal routing layer. Underpass bridge 38 may be formed in metal routing layer 46. Layer 46 may be referred to as the M9 metal routing layer that is one metal routing layer below the M10 metal routing layer. M9 bridge 38 may be connected to respective metal lines 36 through vias 28 that are formed in via layer 52. Via layer 52 is the via layer separating M10 metal routing layer 44 and M9 metal routing layer 46.

FIG. 3 shows a second terminal of lower portion 22B that has vias 28 (e.g., vias in via layer 50) that directly connect lower portion 22B to metal stub 30. Upper portion 22A and lower portion 22B may be series-connected through M11 stub 30 to form the octagonal series-connected inductor.

Inductor 20 of the type described in connection with FIG. 3 is merely illustrative. The upper and lower portions of series-connected inductor 20 are separated by via layer 50 (i.e., portions 22A and 22B are not separated by any intervening metal routing layers). An inductor with consecutive portions formed using this approach may experience undesirable capacitive coupling. Capacitive coupling may lower an inductor's self-resonant frequency, thereby degrading quality factor Q at higher operating frequencies.

Figure 4:
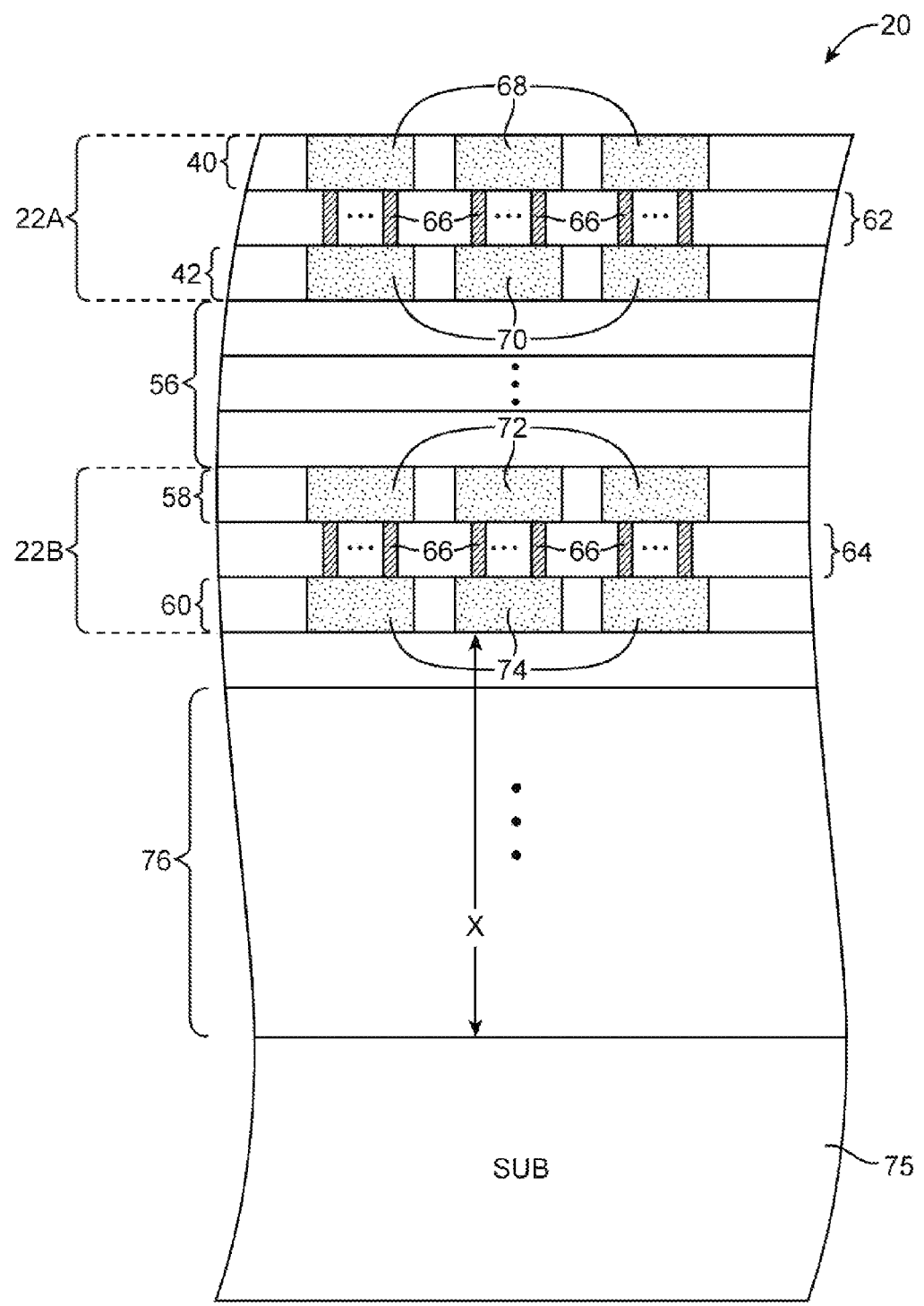
FIG. 4 is a cross-sectional side view of an illustrative series-connected inductor with at least one intervening metal routing layer and metal lines shorted in parallel in accordance with an embodiment of the present invention.

If desired, series-connected inductor 20 of FIGS. 2A and 2B may be formed with at least one intervening metal routing layer, as shown in FIG. 4. FIG. 4 shows a cross-sectional side view of such an inductor sectioned along a cross-sectional cut on dotted line 34 (see, e.g., FIGS. 2A and 2B). Inductor 20 of FIG. 4 may have multiple intervening metal routing layers (i.e., metal routing layers that are devoid of metal within the footprint of the inductor and which therefore serve as interposed dielectric separator layers), as indicated by region 56 in the dielectric stack that separates portions 22A and 22B. Separating the upper and lower portions of inductor 20 with dielectric layers (i.e., empty metal routing layers) may reduce capacitive coupling between the stacked layers of the inductor and may therefore improve the Q value of the inductor by increasing the inductor's self-resonant frequency.

Conductive lines 24 and 36 in respective portions 22A and 22B may each be formed using two (or more) metal routing layers shorted in parallel to reduce resistance and thereby improve Q, as shown in FIG. 4. Metal lines 24 of FIG. 2A may include metal loop-shaped lines 68 and 70 which run parallel to each other and are shorted in parallel by interposed vias 66. Metal lines 68 and 70 may be respectively formed in metal routing layers 40 and 42 while vias 66 may be formed in via layer 62. Similarly, metal lines 36 of FIG. 2B may include loop-shaped (i.e., square loop-shaped, hexagonal loop-shaped, or other suitable loop-shaped) metal wires 72 and 74 shorted in parallel by vias 66 formed in via layer 64. Metal wires 72 and 74 may be formed in metal routing layers 58 and 60, respectively.

For example, metal lines 68 and 70 may be formed in the AP metal routing layer and an M12 metal routing layer, respectively (e.g., assuming integrated circuit 10 is formed using a twelve-layer interconnect technology). Underpass bridges 26 may be formed in an M11 metal routing layer.

In this example, one intervening metal routing layer may be formed that separates upper portion 22A and lower portion 22B. Region 56 may therefore include one metal routing layer (i.e., an M10 intervening metal routing layer that does not include any inductor metal lines). Metal lines 72 and 74 may be formed in an M9 metal routing layer and an M8 metal routing layer, respectively. Underpass bridges 38 may be formed in an M7 metal routing layer. If desired, bridges 38 may be formed in the M10 metal routing layer to serve as overpass bridges. At least one metal stub structure may be formed in the intervening metal routing layer (e.g., the M10 layer) to series-connect the upper and lower inductor portions.

Inductors such as inductor 20 of FIG. 4 with upper and lower portions that each have metal lines shorted in parallel may exhibit reduced series resistance for a given inductance value and may therefore be characterized by enhanced quality factors Q.

Inductor 20 may have a bottommost layer (e.g., the bottom layer of lower portion 22B) that is separated from the surface of semiconductor substrate 75 by a distance x, as shown in FIG. 4. Other circuitry or metal routing may be formed in region 76 below inductor 20, if desired. Region 76 may include the remaining metal routing layers and via layers in the dielectric stack.

In general, it is desirable to keep inductor 20 relatively far away from the surface of the substrate (i.e., to maximize x) to prevent electromagnetically induced eddy currents from flowing through the substrate. The presence of eddy currents may degrade the Q value. This presents a design challenge. It is desirable to short lines in parallel to reduce series resistance, but doing so increases the number of layers in the inductor and undesirably lowers distance x. Intervening blank metal routing layers may be provided to lower capacitive coupling, but doing so also decreases the distance from the lower portion of inductor 20 to the surface of the substrate. In summary, the design of inductor 20 to optimize quality factor Q may require considering a tradeoff among having parallel shorted metal lines, intervening metal routing layers, a greater distance from the inductor to the substrate, etc.

The spiral series-connected inductor 20 described thus far includes two portions (i.e., upper and lower portions 22A and 22B) connected in series. This is merely illustrative. More than two portions may be connected in series through additional metal stubs, if desired (e.g., a third loop portion below the lower loop portion, a fourth loop portion below the third loop portion, etc.).

Figure 5A:
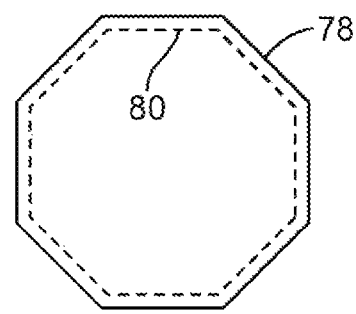
FIG. 5A is a top view showing aligned inductor loop outlines that correspond to upper and lower portions of a series-connected inductor in accordance with an embodiment of the present invention.

An inductor of the type described in connection with FIGS. 3 and 4 may have upper and lower loop portions with respective outlines 78 and 80 (see, e.g., FIGS. 5A and 5B). The upper and lower loop portions may have the same diameter (i.e., a common diameter). With one suitable arrangement, the two portions may be substantially aligned, as shown in FIG. 5A. When laterally aligned in this way, the lines in the upper and lower loops are completely overlapping. This can, however, lead to capacitive coupling effects.

Figure 5B:
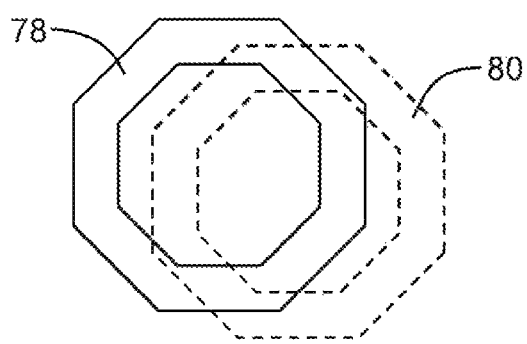
FIG. 5B is a top view showing inductor loops that are laterally offset within a dielectric stack (shifted along the plane of the dielectric stack) so as to form at least partly non-overlapping loops and that correspond to upper and lower portions of a series-connected inductor in accordance with an embodiment of the present invention.

With another suitable arrangement, the two portions may be laterally offset from one another (e.g., so that lines of the upper portion only partially overlap with the lines of the lower portion), as shown in FIG. 5B. Inductors formed using an offset configuration of this type may exhibit reduced coupling capacitance that improves inductor Q factor. Arrangements of the type shown in FIG. 5B may have relatively modest lateral offsets (i.e., so that the upper and lower loops partially overlap when viewed from above as shown in FIG. 5B) or may have more substantial amounts of lateral shift within the plane of the dielectric stack leading to nearly fully non-overlapping configurations. In arrangements with multiple turns, lateral offsets may be used to ensure that none of the turns of the upper loop overlap directly with the turns of the lower loop or may be used to partially shift each turn of one portion with respect to a corresponding turn in the other portion.

Figure 5C:
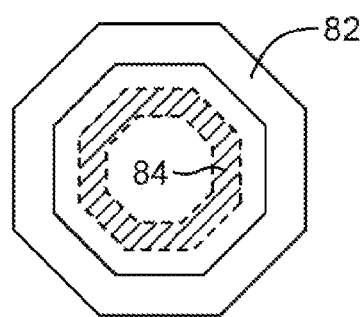
FIG. 5C is a top view showing a first inductor loop portion nested in a second inductor loop portion so that the first and second loop portions are completely non-overlapping in accordance with an embodiment of the present invention.

If desired, the lines of the lower portion of the inductor may be fully nested within the lines of the upper portion of the inductor or vice versa (i.e., so there is no overlap between the inductor lines in respective portions of the loop). As shown in FIG. 5C, the upper and lower portions may be formed within regions 82 and 84, respectively. Because the diameter of the lower loop is smaller than the diameter of the upper loop, regions 82 and 84 do not overlap (i.e., region 82 may be non-overlapping with region 84). Compared to an inductors implemented using an arrangement of the type shown in FIG. 5B, inductors formed using a nested and non-overlapping configuration may provide even lower coupling capacitance to improve quality factor Q.

Figure 6A:
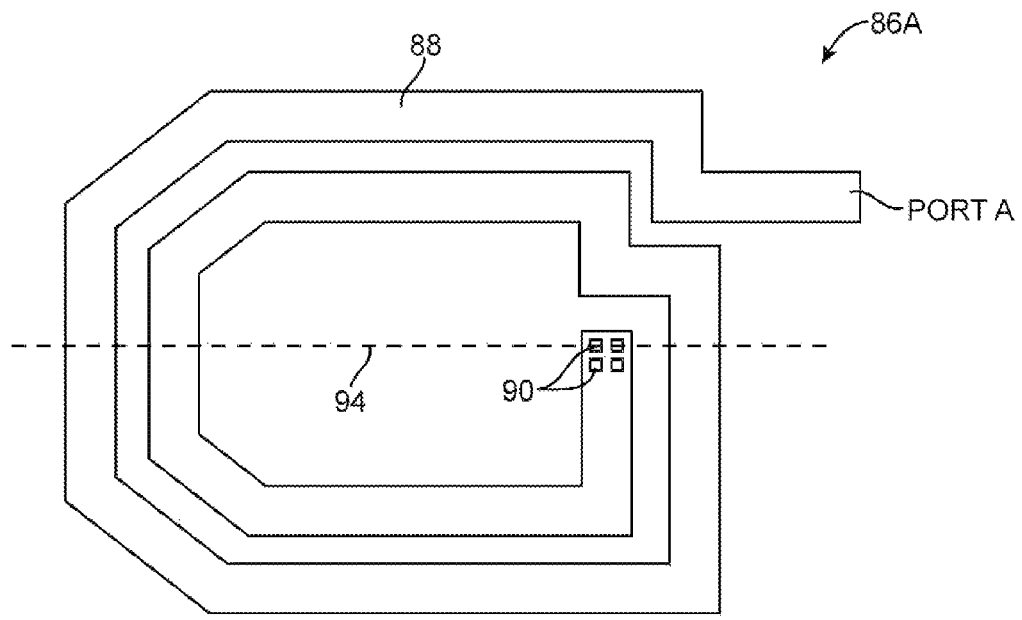
FIG. 6A is a top view of an upper portion of an illustrative hexagonal series-connected inductor in accordance with an embodiment of the present invention.
Figure 6B:
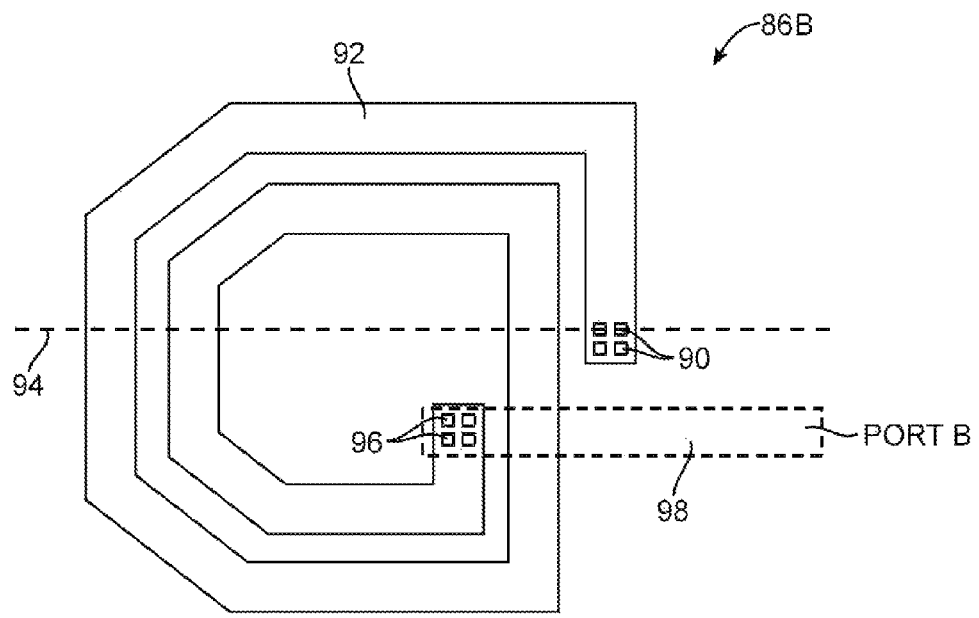
FIG. 6B is a top view of a lower portion of an illustrative hexagonal series-connected inductor in accordance with an embodiment of the present invention.

In another suitable arrangement, inductor 20 may be a hexagonal series-connected inductor (e.g., an inductor with two approximately 90° bends and four approximately 45° bends). A hexagonal series-connected inductor may have two turns and may have an upper portion such as upper portion 86A and a lower portion such as lower portion 86B, as shown in FIGS. 6A and 6B, respectively. The upper and lower portions may be series-connected through metal vias 90.

Upper portion 86A may have a first terminal such as terminal PORTA. Terminal PORTA may serve as a first input-output port of the hexagonal series-connected inductor. Upper portion 86A may have two turns formed using a metal line such as loop-shaped metal line 88. Lines 88 may be formed in a first metal routing layer. Upper portion 86A may have a second terminal that includes metal vias 90. Vias 90 may directly connect upper portion 86A to lower portion 86B.

Lower portion 86B may have a first terminal that is connected to vias 90. Lower portion 86B may have two turns formed using a metal line such as loop-shaped metal line 92. Lines 92 may be formed in a second metal routing layer that is below the first metal routing layer. Lower portion 86B may have a second terminal that includes vias 96 connected to metal line 98 that is formed in a third metal routing layer that is below the second metal routing layer. Metal line 98 may have a terminal such as terminal PORTB. Terminal PORTB may serve as a second input-output port of the hexagonal series-connected inductor.

Figure 7:
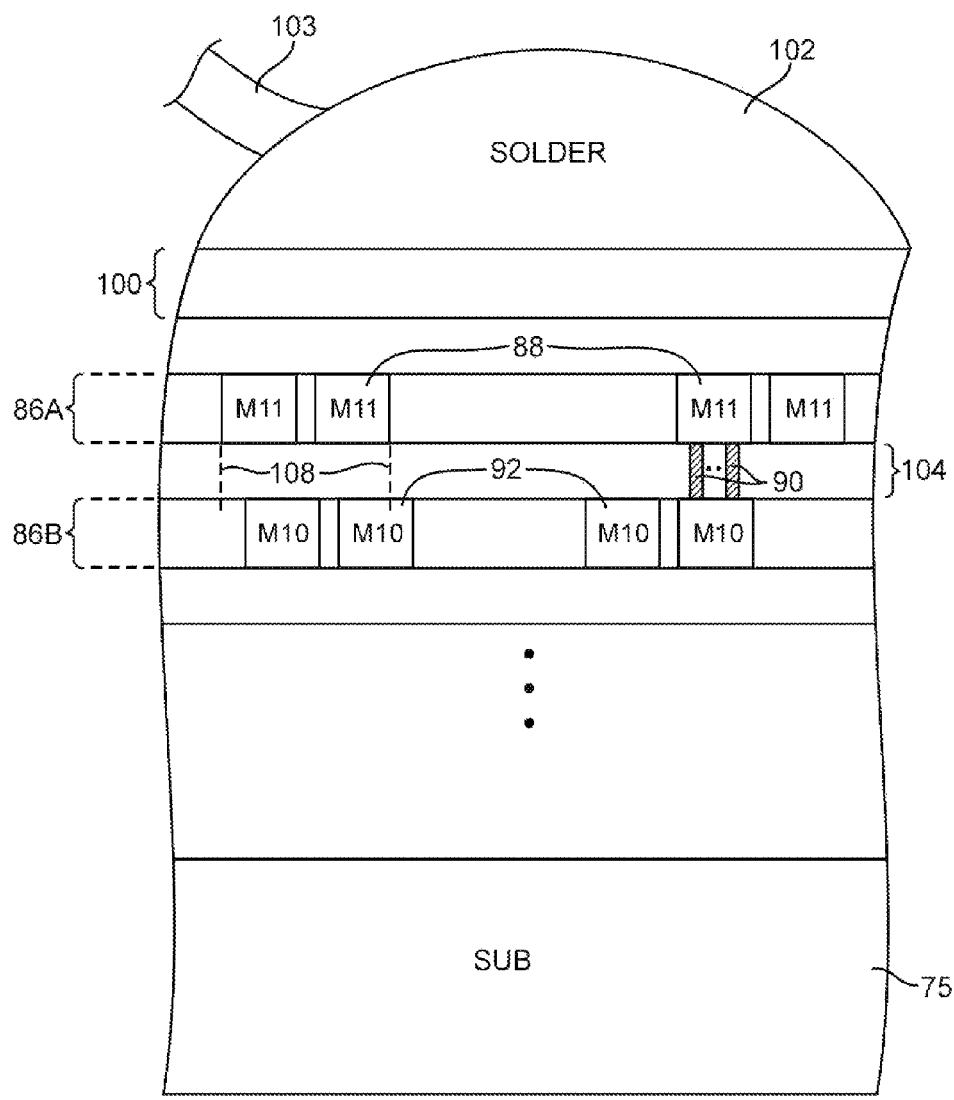
FIG. 7 is a cross-sectional side view of the hexagonal series-connected inductor of FIGS. 6A and 6B in accordance with an embodiment of the present invention.

FIG. 7 is a cross-sectional side view of the hexagonal series-connected inductor of FIGS. 6A and 6B sectioned along a cross-sectional cut on dotted line 94. Upper portion 86A of the series-connected inductor may be formed using the M11 metal routing layer (e.g., metal lines 88 are formed in the M11 metal routing layer). The M11 metal routing layer may be the metal routing layer directly below AP layer 100. Layer 100 may be the topmost layer of the dielectric stack.

Lower portion 86B of the hexagonal inductor may be formed using the M10 metal routing layers (e.g., metal lines 92 may be formed in the M10 metal routing layer). Upper portion 86A may be connected to lower portion 86B through vias 90, as shown in FIG. 7. Vias 90 may be formed in via layer 104 that separates the M10 and M11 metal routing layers. The metal lines of portions 86A and 86B may be offset from one another, as indicated by dotted lines 108.

The hexagonal series-connected inductor may be formed under a solder pad. For example, solder 102 may be formed over AP layer 100 to connect AP layer to a line lead, a package pad, or other external conductor, as shown schematically by conductor 103 in FIG. 7. The hexagonal inductor may serve to eliminate undesirable noise sources (e.g., high frequency signal perturbations) associated with signals passing through the electrical connection provided by solder 102 and conductor 103.

Hexagonal series-connected inductor configurations of the type described in connection with FIGS. 6A, 6B, and 7 are merely illustrative. Any number of turns may be used to form hexagonal inductor 20 (e.g., one turn, two turns, three turns, more than three turns, etc.). If desired, the hexagonal inductor may have upper and lower portions formed using metal lines shorted in parallel, at least one intervening layer between the upper the lower portions, a substantially offset configuration (e.g., a configuration in which the upper portion only partially overlaps the lower portion), a nested configuration (e.g., a configuration in which the upper portion does not overlap with the lower portion), any desired shape (e.g., octagonal, hexagonal, rectangular, etc.), any number of metal routing layers, any combination of these attributes, etc.

The foregoing is merely illustrative of the principles of this invention and various modifications can be made by those skilled in the art without departing from the scope and spirit of the invention.

What is claimed is:

1. An integrated circuit inductor formed in a dielectric stack, comprising:
    a first loop including at least one 45° bend formed in a first metal routing layer in the dielectric stack;
    a second loop including at least one 45° bend formed in a second metal routing layer in the dielectric stack, wherein the first and second loops are connected in series; and
    a third metal routing layer devoid of loops that is interposed between the first and second metal routing layers.

2. The integrated circuit inductor defined in claim 1 wherein the first loop is nested within the second loop so that the first loop is non-overlapping with the second loop.

3. The integrated circuit inductor defined in claim 1 wherein the first loop is laterally offset with respect to the second loop so that the first and second loops are at least partly non-overlapping.

4. The integrated circuit inductor defined in claim 1 wherein the first and second loops have octagonal shapes.

5. The integrated circuit inductor defined in claim 1, wherein the first and second loops each have six sides and wherein the first and second loops each include at least one 90° bend.

6. The integrated circuit inductor defined in claim 1, wherein the first and second loops each include at least a pair of conductive loop-shaped lines that are shorted to each other in parallel by vias.

7. An integrated circuit inductor formed in a dielectric stack, comprising:
    an upper loop portion that includes at least a pair of conductive loop-shaped lines that are shorted to each other in parallel by vias; and
    a lower loop portion that includes at least a pair of conductive loop-shaped lines that are shorted to each other in parallel by vias, wherein the upper and lower loop portions are connected in series and are formed in respective layers of the dielectric stack.

8. The integrated circuit inductor defined in claim 7, wherein the upper loop portion further comprises at least one additional conductive loop-shaped line that is shorted in parallel to the pair of conductive loop-shaped lines in the upper loop by vias and wherein the lower loop portion further comprises at least one additional conductive loop-shaped line that is shorted in parallel with the pair of conductive loop-shaped lines in the lower loop portion by vias.

9. The integrated circuit inductor defined in claim 7, wherein the pair of loop-shaped lines in the upper loop portion has loop-shaped lines that are formed respectively in first and second metal routing layers, wherein the pair of loop-shaped lines in the lower loop portion has loop-shaped lines that are formed respectively in third and fourth metal routing layers, and further comprising:
    at least one dielectric metal routing layer that is devoid of metal and that is interposed between the first and second metal routing layers and the third and fourth metal routing layers.

10. The integrated circuit inductor defined in claim 7 further comprising:
    an additional loop portion that includes at least a pair of conductive loop-shaped lines that are shorted to each other in parallel by vias, wherein the lower loop portion and the additional loop portion are connected in series and are formed in separate layers of the dielectric stack.

11. The integrated circuit inductor defined in claim 7 wherein the upper loop portion and lower loop portion are nested within one another and do not overlap with each other.

12. The integrated circuit inductor defined in claim 7, wherein the upper and lower loop portions have a common diameter and wherein the upper loop portion is laterally offset with respect to the lower loop portion so that the upper and lower loop portions are at least partly non-overlapping.

13. An integrated circuit inductor formed in a dielectric stack, comprising:
    an upper loop that includes conductive lines formed in at least a first metal routing layer in the dielectric stack;
    a lower loop that includes conductive lines formed in at least a second metal routing layer in the dielectric stack; and
    at least a third metal routing layer that separates the upper and lower loops and that is devoid of loops, wherein the upper and lower loops are series-connected through metal vias.

14. The integrated circuit inductor defined in claim 13 wherein the upper and lower loops have different diameters and are nested within one another so that the upper and lower loops do not overlap.

15. The integrated circuit inductor defined in claim 13 wherein the upper loop is laterally offset with respect to the lower loop so that the upper and lower loops are at least partly non-overlapping.

16. An integrated circuit inductor formed in a dielectric stack having a pad layer, comprising:
    a first loop formed in at least a first metal routing layer that is adjacent to the pad layer in the dielectric stack; and
    a second loop that is formed in at least a second metal routing layer in the dielectric stack, wherein the first and second loop are connected in series and wherein the first loop is nested within the second loop so that the first loop is non-overlapping with the second loop.

17. The integrated circuit inductor defined in claim 16, further comprising:
    an intervening region interposed between the first and second metal routing layers of the dielectric stack, wherein the intervening region includes at least one metal routing layer that is devoid of conductive loop-shaped lines.

18. The integrated circuit inductor defined in claim 16 wherein the first and second loops each have an octagonal shape with a plurality of 45° bends.

19. The integrated circuit inductor defined in claim 18, wherein the first loop includes at least a pair of conductive loop-shaped lines that are shorted to each other in parallel by vias and wherein the second loop includes at least a pair of conductive loop-shaped lines that are shorted to each other in parallel by vias.

* * * * *